(12) United States Patent
Bran (10) Patent No.: US 7,614,406 B2
(45) Date of Patent: Nov. 10, 2009

(54) METHOD OF CLEANING SUBSTRATES UTILIZING MEGASONIC ENERGY

(75) Inventor: Mario E. Bran, Garden Grove, CA (US)

(73) Assignee: Akrion Systems, LLC

( * ) Notice: Subject to any disclaimer, the term of this patent is extended or adjusted under 35 U.S.C. 154(b) by 0 days.

(21) Appl. No.: 11/873,750

(22) Filed: Oct. 17, 2007

(65) Prior Publication Data
US 2008/0264442 A1 Oct. 30, 2008

Related U.S. Application Data

(62) Division of application No. 10/059,682, filed on Jan. 29, 2002, now Pat. No. 7,287,537.

(51) Int. Cl.
*B08B 3/10* (2006.01)
(52) U.S. Cl. ...................................................... 134/1.3
(58) Field of Classification Search ................. 134/186, 134/184; 68/3 SS
See application file for complete search history.

(56) References Cited

U.S. PATENT DOCUMENTS 5,368,054 A * 11/1994 Koretsky et al. ............. 134/153

| 6,265,323 | B1 * | 7/2001 | Nakamura et al. | 438/748 |
| 6,379,858 | B1 * | 4/2002 | Perry et al. | 430/127 |
| 6,543,080 | B1 * | 4/2003 | Tomita et al. | 15/102 |
| 2002/0066464 | A1 * | 6/2002 | Bergman | 134/1 |

FOREIGN PATENT DOCUMENTS

JP          04-025012     *     1/1992

OTHER PUBLICATIONS

WIPO WO 90/14170 Nov. 1990.*

* cited by examiner

*Primary Examiner*—Frankie L Stinson
(74) *Attorney, Agent, or Firm*—The Belles Group P.C.

(57) ABSTRACT

A method of cleaning a substrate without causing damage to the substrate is provided. The method comprises the steps of providing a transmitter made of a material that is a good conductor of megasonic energy, positioning the transmitter so that a lower edge is positioned spaced from but closely adjacent to a substantially flat surface of the substrate so that when liquid is applied to the edge and the substrate, a meniscus of liquid is formed between the edge and the substrate, providing a transducer for producing megasonic vibration, coupling the transducer to the transmitter so that a transmission path is created to transmit the megasonic vibration into the transmitter, and creating a barrier in the transmission path so that the liquid vibration is attenuated directly beneath the lower edge of the transmitter.

3 Claims, 10 Drawing Sheets

METHOD OF CLEANING SUBSTRATES UTILIZING MEGASONIC ENERGY

CROSS REFERENCE TO RELATED APPLICATIONS

The present application is a Divisional Application of U.S. patent application Ser. No. 10/059,682, filed on Jan. 29, 2002, now U.S. Pat. No. 7,287,537, the entirety of which is hereby incorporated by reference.

FIELD OF THE INVENTION

The present invention relates to a method for cleaning substrates or other items requiring extremely high levels of cleanliness. More particularly, the present invention relates a method of cleaning substrates utilizing megasonic energy that prevents and/or minimizes damage to delicate devices on a substrate.

BACKGROUND OF THE INVENTION

Semiconductor wafers are frequently cleaned in cleaning solution into which megasonic energy is propagated. Megasonic cleaning systems, which operate at frequencies over twenty times higher than ultrasonic, safely and effectively remove particles from materials without the negative side effects associated with ultrasonic cleaning.

Megasonic energy cleaning apparatuses typically comprise a piezoelectric transducer coupled to a transmitter. The transducer is electrically excited such that it vibrates, and the transmitter transmits high frequency energy into liquid in a processing tank. The agitation of the cleaning fluid produced by the megasonic energy loosens particles on the semiconductor wafers. Contaminants are thus vibrated away from the surfaces of the wafer. In one arrangement, fluid enters the wet processing tank from the bottom of the tank and overflows the tank at the top. Contaminants may thus be removed from the tank through the overflow of the fluid and by quickly dumping the fluid.

As semiconductor wafers have increased in diameter, first at 200 mm and now at 300 mm, the option of cleaning one wafer at a time has become more desirable. A single large diameter wafer, having a multitude of devices on it, is more valuable than its smaller diameter counterpart. Larger diameter wafers therefore require greater care than that typically employed with batch cleaning of smaller wafers.

Verteq, Inc. of Santa Ana, Calif. has developed in recent years a megasonic cleaner in which an elongated probe is positioned in close proximity to the upper surface of a horizontally mounted wafer. Cleaning solution applied to the wafer produces a meniscus between the probe and the wafer. Megasonic energy applied to an end of the probe produces a series of vibrations of the probe along its length that are directed toward the wafer through the meniscus. Producing relative movement between the probe and the wafer, such as by rotating the wafer, has been found to be an effective way to loosen particles over the entire surface of the wafer, causing them to be washed away from the rotating wafer. An example of such an arrangement is illustrated in U.S. Pat. No. 6,140,744, assigned to Verteq, Inc., which is incorporated herein by reference.

Such a system provides very effective cleaning. However, as the height and density of deposition layers on wafers have increased, so has the fragility of such wafers. Current cleaning methods, including those using the device of the '744 patent, may result in damage to devices that are positioned upon the wafers. Such damage is, of course, a serious issue, because of the value of each wafer after layers of highly sophisticated devices have been deposited on the wafer. Thus, a need exists to improve the cleaning capability of such a megasonic probe system in a manner that will reduce the risk of damage to these delicate devices.

Through testing, Verteq, Inc. has determined that the extent of damage caused to each wafer is directly proportional to the power, or sonic watt density, applied to the probe. Damage can be reduced, then, by applying lower power. Testing has also shown, however, that reducing applied power may not be the best solution to the wafer damage problem, because reducing applied power may also decrease cleaning effectiveness. Further, simply reducing applied power in order to eliminate wafer damage creates a less versatile cleaning apparatus. For example, a probe assembly that can safely clean at applied power loads up to 50 W has a broader range of uses than a probe assembly that begins to damage wafers at only 15 W.

The most wafer damage results from waves that strike the wafer at a ninety-degree angle. But these waves do not necessarily provide the most effective cleaning. Waves that strike the wafer at angles more shallow than ninety-degrees do provide effective cleaning. Therefore, a modification to the device of the '744 patent that reduces the number of normal-incident waves without significantly reducing the number of more shallow waves would reduce the incidence of wafer damage without compromising the cleaning ability of the device.

SUMMARY OF THE INVENTION

The megasonic probe energy director has several features, no single one of which is solely responsible for its desirable attributes. Without limiting the scope of this megasonic probe energy director as expressed by the claims that follow, its more prominent features will now be discussed briefly. After considering this discussion, and particularly after reading the section entitled "Detailed Description of the Drawings," one will understand how the features of this megasonic probe energy director provide advantages, which include efficient cleaning of wafers with minimal or no damage to devices on the wafers.

Preferred embodiments of the megasonic probe energy director provide effective cleaning of a substrate without causing damage to the substrate. The apparatus includes a megasonic probe, a transducer configured to energize the probe, and may include a coupler disposed between the transducer and the probe. With or without the coupler, the base of the apparatus is configured to direct the sonic energy from the transducer toward specific areas of the probe so as to reduce the ratio of normal-incident waves to shallow-angle waves. The normal-incident waves are those substantially directly beneath the lower edge of the probe, while the shallow angle waves are those adjacent the normal-incident waves.

The ratio of normal-incident waves to shallow-angle waves is reduced by creating a barrier to the megasonic energy in a desired area of the transmission path to the probe. Preferably, the barrier is in the coupling between the transducer and the probe and is aligned with the lower edge of the probe. Preferably, the barrier is created by forming a gap in the path of the megasonic energy through the coupling, such as by forming a recess in the coupler or the rear of the probe. Roughening the surface of either component in that area also creates a barrier.

This arrangement prevents damage to delicate devices on the substrate directly beneath the probe by reducing the ratio of normal-incident waves to shallow-angle waves emanating from the probe. At the same time, the particle loosening produced by the energy of the shallow-angle waves provides very effective in cleaning.

In another embodiment the present invention is a method comprising the steps of providing a transmitter made of a material that is a good conductor of megasonic energy, positioning the transmitter so that a lower edge is positioned spaced from but closely adjacent to a substantially flat surface of the substrate so that when liquid is applied to the edge and the substrate, a meniscus of liquid is formed between the edge and the substrate, providing a transducer for producing megasonic vibration, and creating a barrier in the transmission path so that the megasonic vibration is attenuated directly beneath the lower edge of the transmitter.

BRIEF DESCRIPTION OF THE DRAWINGS

Having thus summarized the general nature of the invention and its essential features and advantages, certain preferred embodiments and modifications thereof will become apparent to those skilled in the art from the detailed description herein having reference to the figures that follow, of which:

FIG. 6 is an exploded view of the probe, coupler, and heat transfer element of FIG. 7a;

DETAILED DESCRIPTION

Figure 1:
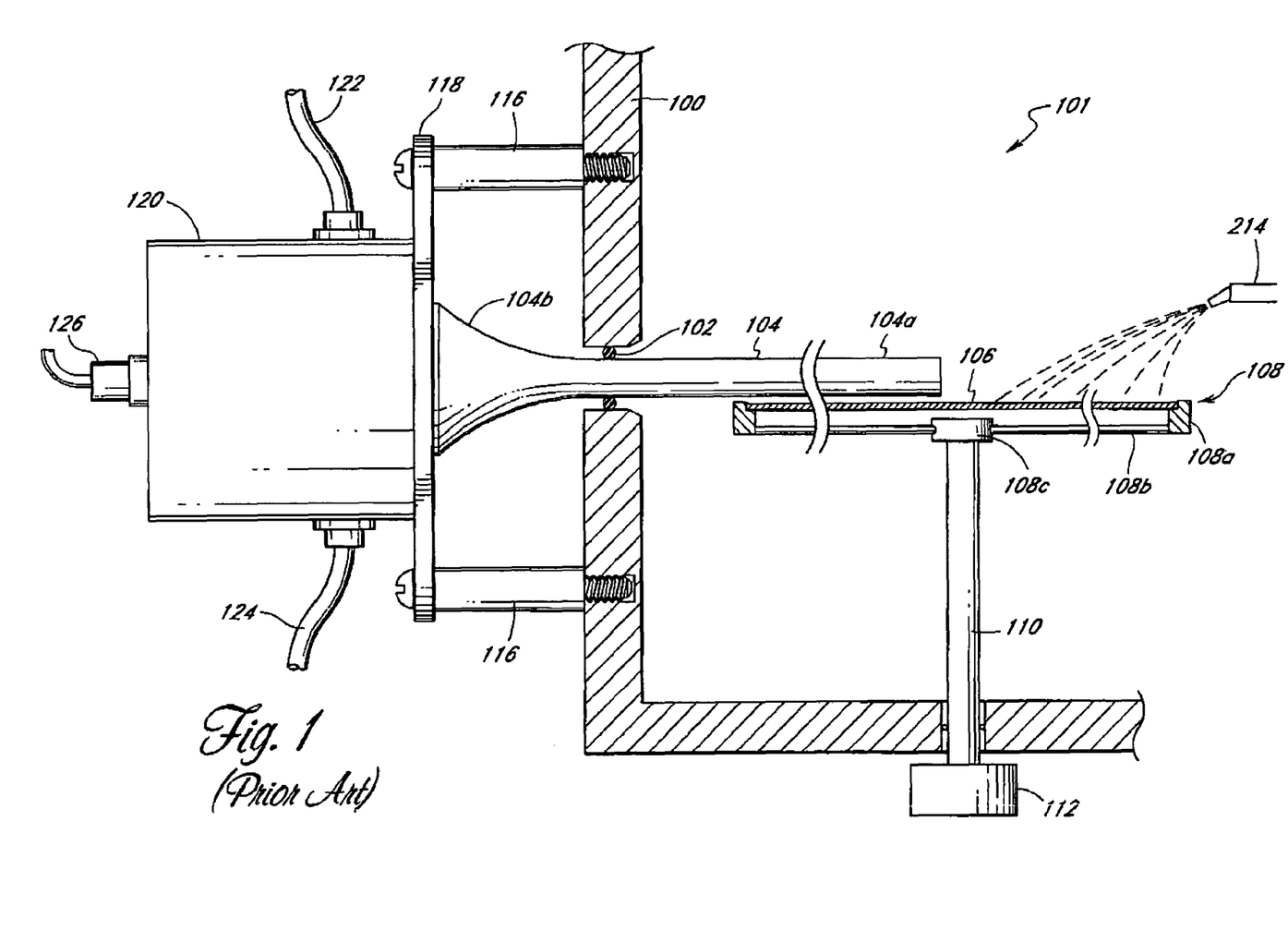
FIG. 1 is a schematic side elevation view of a prior art megasonic energy cleaning system.
Figure 2:
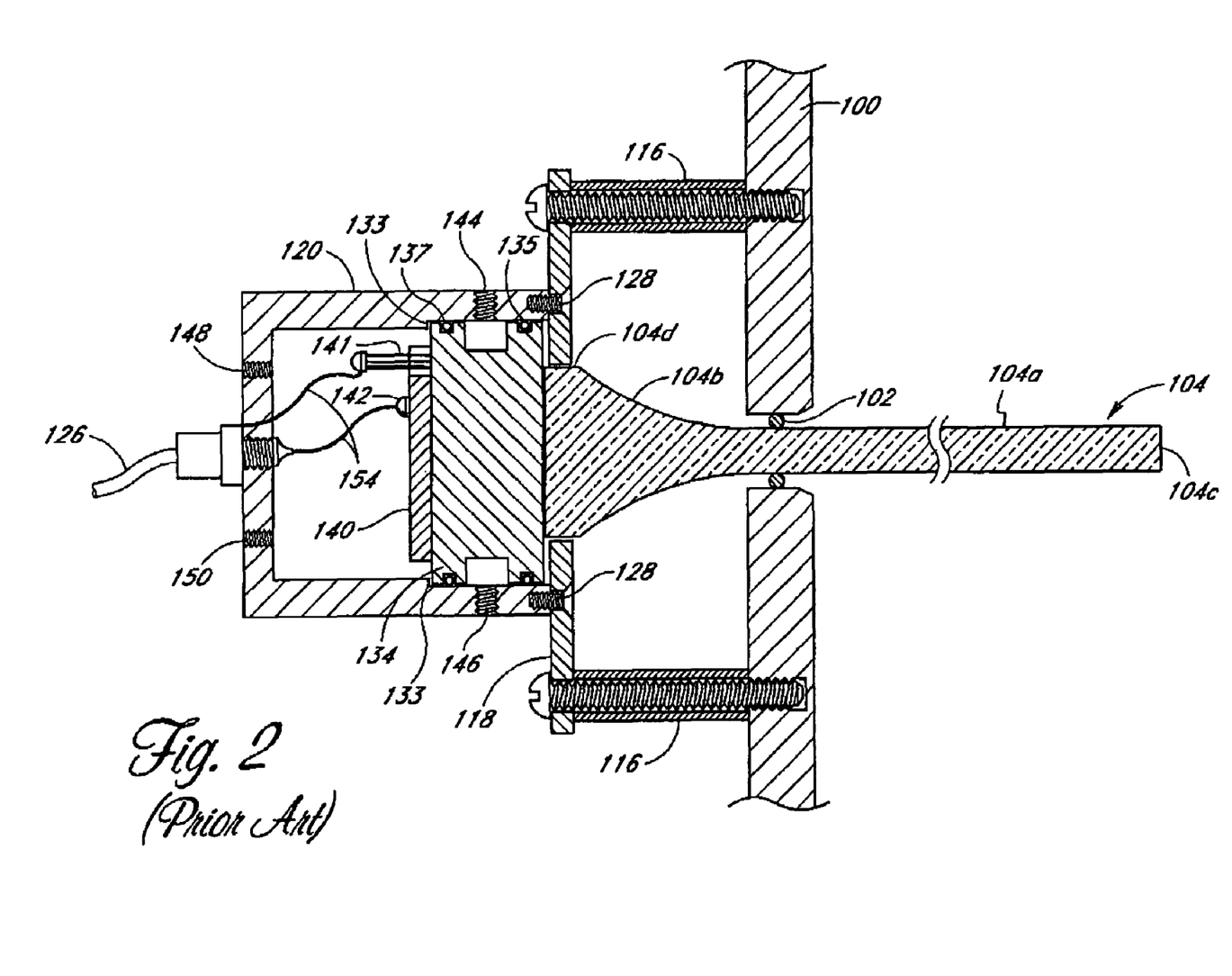
FIG. 2 is a side cross-sectional view of the system shown in FIG. 1.
Figure 3:
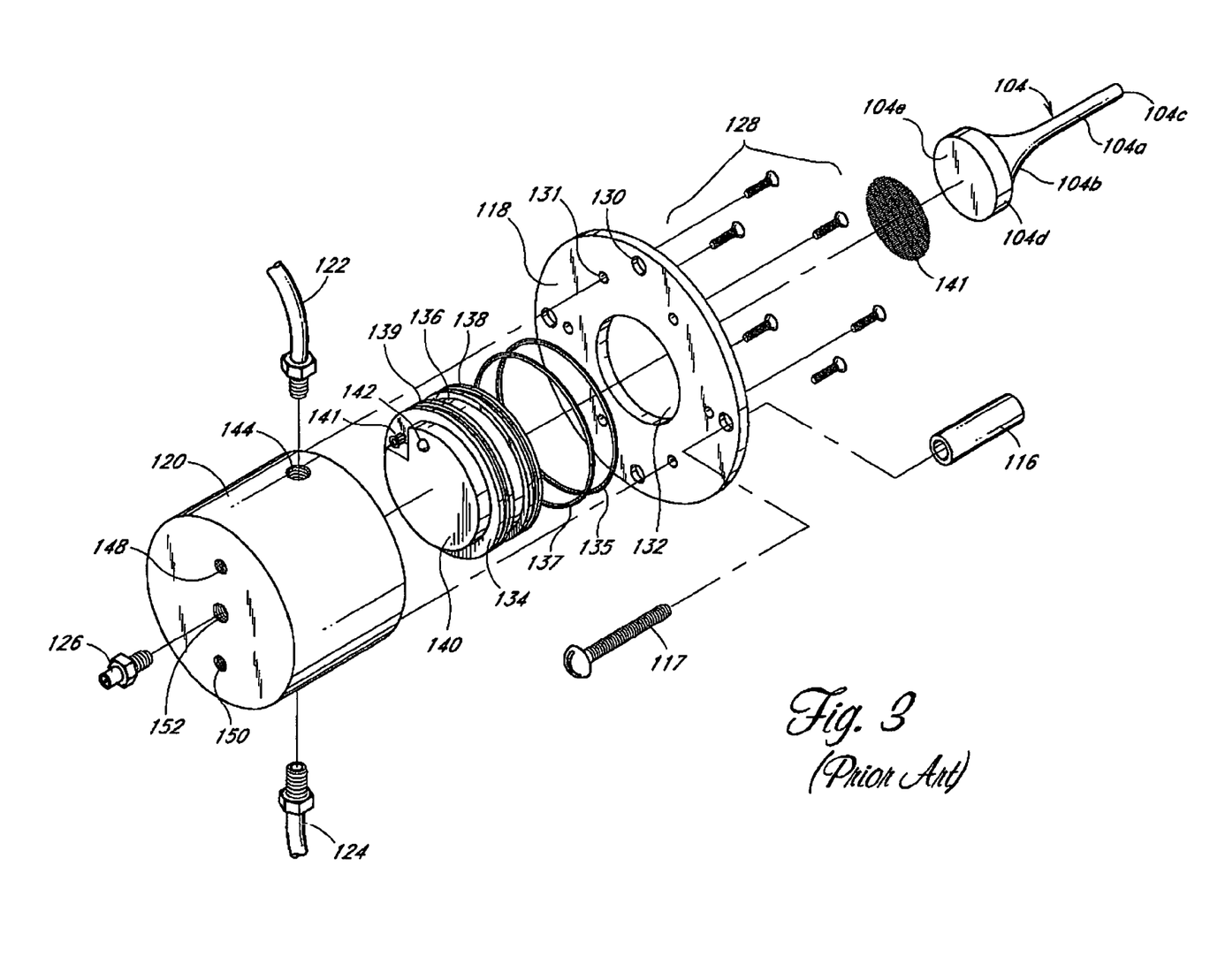
FIG. 3 is an exploded perspective view of the probe assembly shown in FIG. 1.

FIGS. 1-3 illustrate a megasonic energy cleaning apparatus made in accordance with the '744 patent. An elongate probe 104 is inserted through a wall 100 of a processing tank 101. A cleaning portion 104a of the probe 104 is positioned closely above a substrate, such as a wafer 106. The probe 104 is supported on one end outside the tank 101. The processing tank 101 is made of material that does not contaminate the wafer 106.

The tank 101 may have an inlet (not shown) for introducing fluid into the tank 101 and an outlet (not shown) to carry away particles removed from the wafer 106. In a preferred embodiment, such as that shown in FIG. 1, cleaning liquid is sprayed onto the wafer 106 via a nozzle 214. In this arrangement the tank 101 merely confines spray. In another preferred embodiment (not shown), however, the tank 101 is at least partially filled with cleaning fluid. In this embodiment an O-ring 102 provides a proper seal between the probe 104 and the processing tank 101.

A heat transfer member 134, contained within a housing 120, is acoustically and mechanically coupled to the probe 104. Also contained within the housing 120 is a piezoelectric transducer 140 acoustically coupled to the heat transfer member 134. Stand off 141 and electrical connectors 142, 154, 126 are connected between the transducer 140 and a source of electrical energy (not shown). In the illustrated embodiment, electrical connector 142 comprises a drop of solder, and electrical connector 154 comprises a wire.

The housing 120 has openings 144, 146 that support an inlet conduit 122 and an outlet conduit 124, respectively, for coolant. The housing 120 also has an opening 152 for electrical connectors 126, 154, which are visible in FIG. 2. Openings 148, 150 allow a gaseous coolant to enter and exit the housing 120. The housing 120 is preferably made of aluminum to facilitate heat transfer to the coolant(s).

The open end of the housing 120 is partially closed by an annular plate 118 with an opening 132 through which the probe 104 passes. The annular plate 118 has an outer diameter extending beyond the housing 120 and has a plurality of holes organized in an outer ring 130 and an inner ring 131. A plurality of connectors 128, such as screws, extend through the inner ring 131 to attach the plate 118 to the housing 120. The annular plate 118 is mounted to the tank wall 100 by a plurality of threaded fasteners 117 that extend through the outer ring 130 and thread into the tank wall 100. The fasteners 117 also extend through sleeves or spacers 116 that space the plate 118 from the tank wall 100. The spacers 116 position the housing 120 and flared probe rear portion 104b outside the tank 101, so that only the probe cleaning portion 104a extends into the tank 101. Also, the spacers 116 isolate the plate 118 and the housing 120 from the tank 101 somewhat, so that vibration from the transducer 140 to the wall 100 is minimized.

Within the processing tank 101, a support or susceptor 108 is positioned parallel to and in close proximity to the probe 104 (FIG. 1). The susceptor 108 may take various forms. The illustrated arrangement includes an outer rim 108a supported by a plurality of spokes 108b. The spokes are connected to a hub 108c, which is supported on a shaft 110, which extends through a bottom wall of the processing tank 101. Outside the tank 101, the shaft 110 is connected to a motor 112.

The probe 104 comprises a solid, elongated, spindle-like or probe-like cleaning portion 104a, and a base or rear portion 104b. The cross-section of the probe 104 may be round and, advantageously, the diameter of the cleaning portion 104a is smaller in diameter than the rear portion 104b. In a preferred embodiment the area of a probe rear face 104e is approximately 25 times that of a cross section of the probe cleaning portion 104a. Of course, cross-sectional shapes other than circular may be employed.

The probe 104 is preferably made of a relatively inert, non-contaminating material, such as quartz, which efficiently transmits acoustic energy. While using a quartz probe is satisfactory for most cleaning solutions, solutions containing hydrofluoric acid can etch quartz. Thus, a probe made of sapphire, silicon carbide, boron, nitride, vitreous carbon, glassy carbon coated graphite, or other suitable materials may be employed instead of quartz. Also, quartz may be coated by a material that is inert with respect to HF, such as silicon carbide, silicon nitride or vitreous carbon.

A cylindrically-shaped cleaning portion 104a having a small diameter is desirable to concentrate the megasonic energy along the length of the probe 104. The diameter of the probe 104 is preferably sufficient to withstand mechanical vibration produced by the megasonic energy transmitted by the probe 104. In effect, the probe diameter is minutely expanding and contracting at spaced locations along the length of the probe 104. Preferably, the radius of the probe cleaning portion 104a is equal to or smaller than the wavelength of the frequency of the energy applied to it. This structure produces a desired standing surface wave action that directs energy radially into liquid contacting the probe 104. In a preferred embodiment, the radius of the probe cleaning portion 104a is approximately 0.2 inches, and a wavelength of the energy in the probe 104 is about 0.28 inches. This configuration produces 3 to 4 wavelengths per inch along the probe length.

The probe cleaning portion 104a is preferably long enough so that the entire surface area of the wafer 106 is exposed to the probe 104 during wafer cleaning. In a preferred embodiment, because the wafer 106 is rotated beneath the probe 104, the cleaning portion 104a is preferably long enough to reach at least the center of the wafer 106. Therefore, as the wafer 106 is rotated beneath the probe 104, the entire surface area of the wafer 106 passes beneath the probe 104. The probe 104 could probably function satisfactorily even if it does not reach the center of the wafer 106 since megasonic vibration from the probe tip would provide some agitation toward the wafer center. Advantageously, the length of the probe 104 may vary depending upon the size of the wafer to be cleaned. Further, the extent to which the probe 104 reaches into the tank 101 may be adjusted by varying the length of the spacers 116.

The length of the probe cleaning portion 104a is also determined by a desired number of wavelengths. Usually, probe lengths vary in increments of half wavelengths of the energy applied to the probe 104. In one embodiment, the length of the probe cleaning portion 104a equals thirty-eight half wavelengths of the applied energy. Due to variations in transducers it is necessary to tune the transducer 140 to obtain the desired wavelength, so that it works at its most efficient point.

The probe rear portion 104b, which is positioned outside the tank 101, flares to a diameter larger than the diameter of the cleaning portion 104a. In the embodiment shown in FIGS. 1-3, the diameter of the rear portion of the probe gradually increases to a cylindrical section 104d. The large surface area of the probe end face 104e is advantageous for transmitting a large amount of megasonic energy, which is then concentrated in the smaller-diameter cleaning portion 104a.

The probe base 104d is acoustically coupled to a heat transfer member 134, which physically supports the probe 104. In the embodiment of FIGS. 1-3, the probe end face 104e is bonded or glued to the heat transfer member 134 by a suitable adhesive. In addition to the adhesive, a thin metal screen 141 (FIG. 3), is preferably sandwiched between the probe end face 104c and the member 134. The screen 141, with its small holes filled with adhesive, provides a more permanent vibration connection than that obtained with the adhesive alone. The adhesive maintains a uniform "bond line" by filling in irregularities on the surfaces of the probe end face 104c and the heat transfer member 134. These irregularities would otherwise be filled with air, which would disrupt the transmission of megasonic energy from the support to the probe 104, as described below.

The screen utilized in a prototype arrangement was of the expanded metal type, about 0.002 inches thick with pockets between flattened strands capturing the adhesive. The screen material is sold by a U.S. company, Delkar. Alternatively, the screen 141 may be made of beryllium copper, about 0.001 inches thick, made by various companies using chemical milling-processes.

The transducer 140 and the heat transfer member 134 are both contained within the housing 120, which is preferably cylindrical in shape. The heat transfer member 134 is captured within an annular recess 133 in an inner wall of the housing 120. The heat transfer member 134 is made of aluminum, or some other good conductor of heat and megasonic energy, such as magnesium. In the arrangement illustrated in FIGS. 2 and 3, the heat transfer member 134 is cylindrical and has an annular groove 136, which serves as a coolant duct. Smaller annular grooves 138, 139 on both sides of the coolant groove 136 are fitted with suitable seals, such as O-rings 135, 137 to isolate the coolant and prevent it from interfering with the electrical connections to the transducer 140.

The transducer 140 is bonded, glued, or otherwise acoustically coupled to the rear flat surface of the heat transfer member 134. A suitable bonding material is that identified as ECF 558, available from Ablestick of Rancho Dominguez, Calif. The transducer 140 is preferably disc shaped and has a diameter larger than the diameter of the probe rear section 104d to maximize transfer of acoustic energy from the transducer 140 to the probe 104. The heat transfer member 134 is preferably gold-plated on its end faces to prevent oxidizing of the aluminum, thereby providing better bonding with both the transducer 140 and the probe 104. The member 134 preferably has an axial thickness that is approximately equal to a multiple of the half-wavelength of the energy to be applied to the probe 104.

Figure 4:
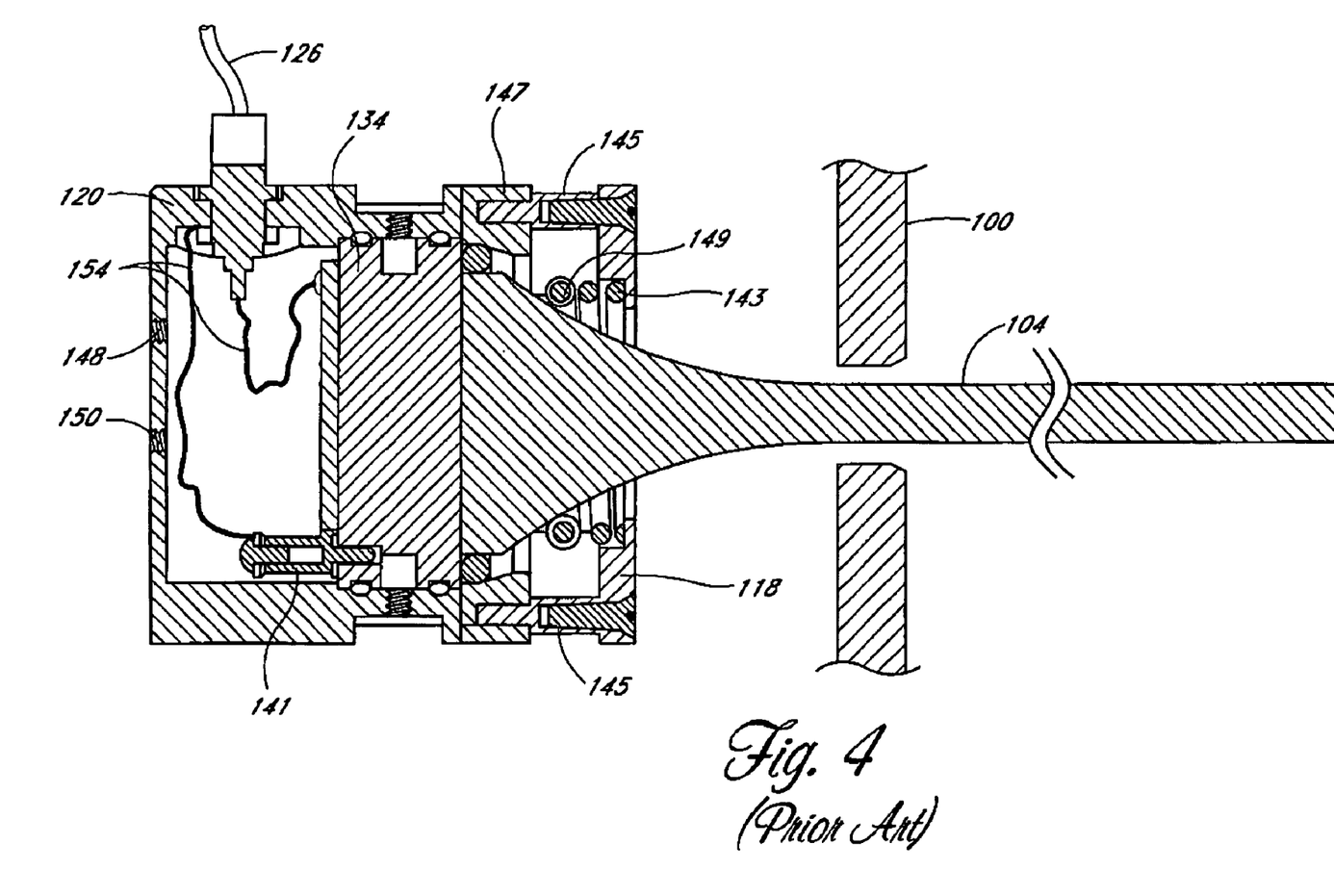
FIG. 4 is a side cross-sectional view of another prior art megasonic energy cleaning system.

An alternative arrangement for coupling the probe 104 to the member 134 is illustrated in FIG. 4. Rather than bonding the probe end face 104e to the member 134, a vacuum grease is applied to the screen 141, and the probe 104 is pressed against the member 134 by a coil spring 143. Vacuum grease is a viscous grease that can withstand pressures on opposite sides of a joint without leaking or being readily displaced. In a prototype arrangement, the grease employed was Fomblin Perfluorinated Grease, purchased from Ausimont of Bollate, Italy. The combination of the grease and the metal spring provided a reliable acoustic coupling.

In the embodiment of FIG. 4, instead of mounting the housing 120 directly to the plate 118, the housing 120 is mounted to a ring 147, which is in turn mounted by standoffs 145 to the plate 118. This configuration creates a gap between the housing 120 and the plate 118. The coil spring 143 is positioned in this gap and compressed between the plate 118 and the tapered portion of the probe 104b. Thus, the spring 143 presses the probe 104 toward the member 134. A Teflon sleeve 149 is preferably positioned over the coil of the spring 143 that abuts the probe 104, so that the metal spring 143 does not damage the quartz probe 104. In the embodiment of FIG. 4, electrical connector 126 is positioned on a side of the housing 120.

Other configurations for acoustically coupling the probe 104 to the heat transfer member 134 are possible. For example, the probe 104 may be clamped to the heat transfer member 134. Any configuration wherein the probe 104 is adequately physically supported and megasonic energy is efficiently transmitted to the probe 104 is within the spirit of the megasonic probe energy director.

As the size of semiconductor wafers increases, rather than cleaning a cassette of wafers al once, it is more practical and less expensive to use a cleaning apparatus and method that cleans one wafer at a time. A semiconductor wafer 106 or other article to be cleaned is placed on the support 108 within the tank 101. The wafer 106 is positioned sufficiently close to the probe 104 to create a meniscus of fluid between the probe and the wafer and so that the agitation of the fluid between the probe 104 and the wafer 106 loosens particles on the surface of the wafer 106. Preferably, the distance between the probe 104 and the surface of the wafer 106 is in the range of about 0.1 inches.

The motor 112 rotates the support 108 beneath the probe 104 so that the entire tipper surface of the wafer 106 passes directly beneath the vibrating probe 104. The rotation speed will vary depending upon the wafer size. For an 8" diameter wafer, however, preferred rotation speeds are from 5 to 30 revolutions per minute, and more preferably from 15 to 20 rpm.

Longer cleaning times produce cleaner wafers. However, shorter cleaning times increase throughput, thereby increasing productivity. Preferred cleaning times with the preferred embodiments of the megasonic probe energy director are from 5 seconds to 3 minutes, and more preferably from 15 seconds to 1 minute.

When the piezoelectric transducer 140 is electrically excited, it vibrates at a high frequency. Preferably the transducer 140 is energized at megasonic frequencies with the desired wattage consistent with the probe size and work to be performed. The vibration is transmitted through the heat transfer member 134 and to the elongated probe 104. The probe 104 then transmits the high frequency energy into cleaning fluid between the probe 104 and the % wafer 106. One of the significant advantages of this arrangement is that the large probe rear portion 104d can accommodate a large transducer 140, and the smaller probe cleaning portion 104a concentrates the megasonic vibration into a small area so as to maximize particle loosening capability. Sufficient fluid between the probe 104 and the wafer 106 effectively transmits the energy across the small gap between the probe 104 and the wafer 106 to produce the desired cleaning. As each area of the wafer 106 approaches and passes the probe 104, the agitation of the fluid between the probe 104 and the wafer 106 loosens particles on the semiconductor wafer 106. Contaminants are thus vibrated away from the wafer surface. The loosened particles may be carried away by a continuous fluid flow.

Applying significant wattage to the transducer 140 generates considerable heat, which could damage the transducer 140. While it is unlikely that the transducer 140 will generate enough heat to damage the quartz probe 104, physical properties of the adhesive or grease between the probe 104 and heat transfer element 134 may be affected by extreme temperatures. Therefore, coolant is pumped through the housing 120 to cool the member 134 and, hence, the transducer 140.

A first coolant, preferably a liquid such as water, is introduced into one side of the housing 120 through the opening 144, circulates through the duct 136 around the heat transfer member 134, and exits the opposite end of the housing 120 through the opening 146. Because the heat transfer member 134 has good thermal conductivity, significant quantities of heat may be easily conducted away by the liquid coolant. The rate of cooling can, of course, be readily altered by changing the flow rate and/or temperature of the coolant.

A second, optional, coolant circulates over the transducer 140 by entering and exiting the housing 120 through openings 148, 150 on the closed end of the housing 120. Due to the presence of the transducer 140 and the electrical wiring 142, 154, an inert gas such as nitrogen is used as a coolant in this portion of the housing 120.

In use, deionized water or other cleaning solution may be sprayed onto the wafer upper surface from a nozzle 214 while the probe 104 is acoustically energized. As an alternative to spraying the cleaning solution onto the wafer 106 from a nozzle, the tank 101 may be filled with cleaning solution. In the spray-on method, the liquid creates a meniscus 216 between the lower portion of the probe 104 and the adjacent upper surface of the rotating wafer 106. The meniscus 216, schematically illustrated in FIG. 5, wets a lower portion of the probe cross section. The size of the arc defined by the wetted portion of the cross-section varies according to the properties of the liquid used in the cleaning solution, the material used to construct the probe 104, and the vertical distance between the wafer 106 and the lower edge of the probe 104. The vertical distance between the wafer 106 and the lower edge of the probe 104 is preferably about one wavelength of the sonic energy in the cleaning solution. Using deionized water as the cleaning solution, a quartz probe 104 and a distance of 0.07" between the wafer 106 and the lower edge of the probe 104, the arc defined by the wetted portion of the probe cross-section is preferably about 90 degree.

The cleaning solution provides a medium through which megasonic energy within the probe 104 is transmitted transversely from the probe 104 and through the meniscus to the wafer surface to loosen particles. These loosened particles are flushed away by the continuously flowing spray and the rotating wafer 106. When the liquid flow is interrupted, a certain amount of drying action is obtained through centrifugal force, with the liquid being thrown from the wafer 106.

Because the components present on a typical silicon wafer 106 are rather delicate, care must be taken during the cleaning process to ensure that none of these components are damaged. As the amount of power applied to the probe 104 is increased, the amount of energy transferred from the probe 104 to the cleaning solution is increased, and the amount of energy transferred from the cleaning solution to the wafer 106 is also increased. As a general rule, the greater the power applied to the wafer 106, the greater the potential for wafer damage. Thus, one method of decreasing wafer damage is to decrease the power supplied to the transducer 140, thereby limiting the power transmitted to the probe 104.

Testing has also shown, however, that reducing applied power may not be the best solution to the wafer damage problem, because reducing applied power may also decrease cleaning effectiveness. Further, simply reducing applied power in order to eliminate wafer damage creates a less versatile cleaning apparatus. For example, a probe assembly that can safely clean at applied power loads up to 50 W has a broader range of uses than a probe assembly that begins to damage wafers at only 15 W.

Figure 5:
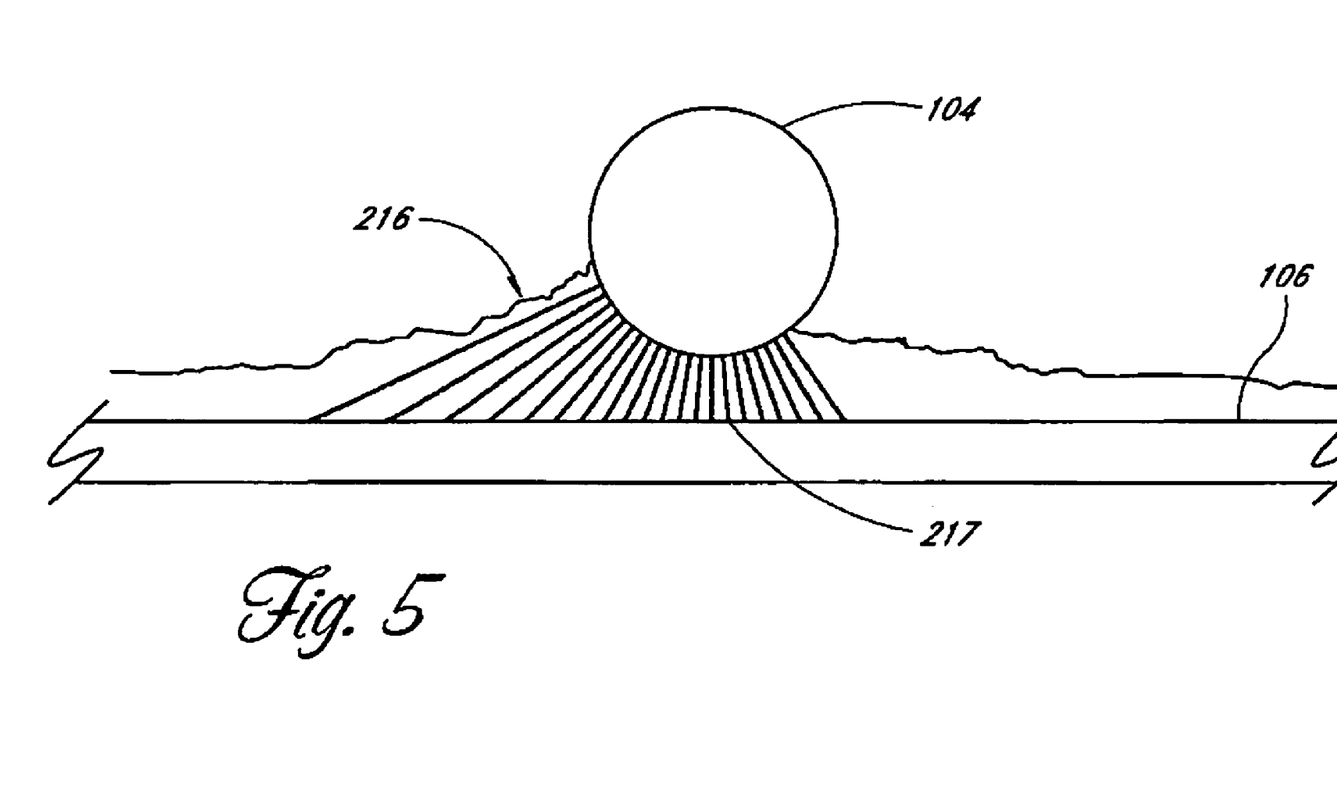
FIG. 5 is a schematic front-view of the probe of FIG. 1, illustrating the formation of a liquid meniscus between the probe and a silicon wafer.

As illustrated schematically in FIG. 5, the zone 217 of greatest wafer damage is directly beneath the center of the cylindrical probe 104. The pattern of sonic wave emission from the probe 104 produces this wafer damage pattern. For a circular probe cross-section, waves emanate radially, or perpendicularly from all points on the circle. Therefore, waves emanating from near the bottom of the circle strike the wafer surface at or near a ninety-degree angle. These normal-incident waves strike the wafer surface with the greatest intensity, because their energy is spread out over a minimal area. The concentration of energy in a relatively small area may damage the delicate components on the wafer surface.

Waves emanating from points along the circle that are spaced from the bottom strike the wafer surface at more shallow angles. The energy transferred to the wafer 106 by these waves is less intense than the energy transferred by waves that emanate from at or near the bottom, because the energy from these waves is spread over a larger area. For each wave, the further from the bottom of the circle it emanates, the more shallow is the angle at which it strikes the wafer surface and, hence, the less intense is the energy transferred to the wafer 106.

Figure 6:
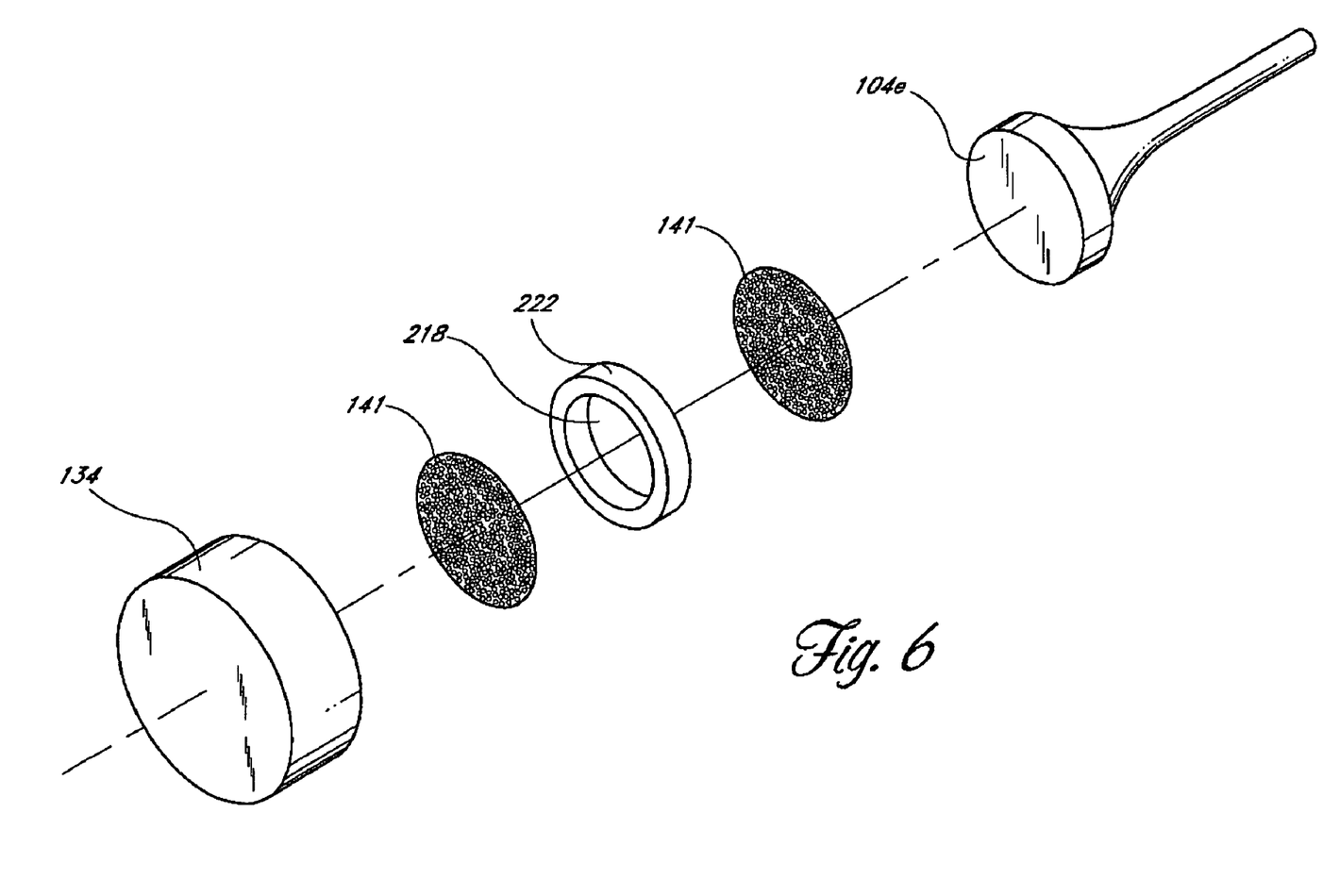

These shallow-angle waves generally provide sufficient intensity to effectively clean the wafer surface without causing the damage that is characteristic of normal-incident waves. Thus, one preferred embodiment of the megasonic probe energy director involves creating a barrier in the energy transmission path that reduces the energy transmitted in a desired area. Such a barrier may be created by inserting a coupler 222 including a gap 218 (FIG. 6) between the heat transfer element 134 and the probe base 104*d*. The gap 218 hinders the transmission of megasonic energy to the probe 104, thus altering the pattern of sonic wave emission from the probe 104. Preferably, the altered pattern has lowered cleaning activity produced by normal-incident waves relative to shallow-angle waves. Desirably, however, certain portions of the coupler 222 allow megasonic energy to travel into the probe 104. Thus, like the heat transfer element 134, the coupler 222 is preferably constructed from a material that is a good conductor of megasonic energy, such as aluminum or magnesium, for example.

Figure 7A:
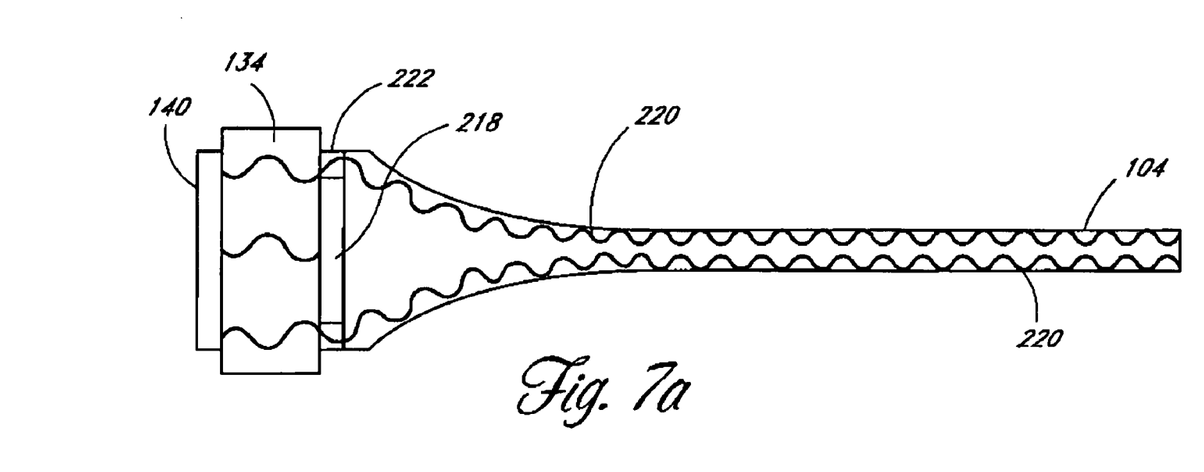
FIG. 7a is a side elevation view of the probe of FIG. 1, a coupler, a heat transfer element, and a transducer, illustrating the manner in which the coupler selectively disrupts the transfer of megasonic energy to the probe.
Figure 7B:
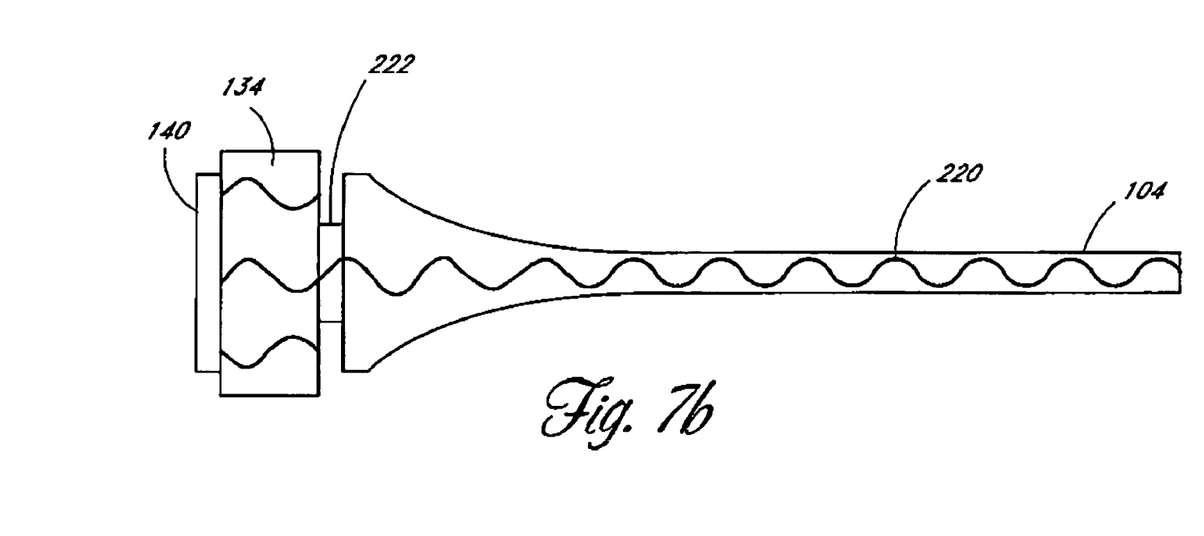
FIG. 7b is a side elevation view of the probe of FIG. 1, a coupler, a heat transfer element, and a transducer, illustrating the manner in which the coupler selectively disrupts the transfer of megasonic energy to the probe.

FIGS. 7*a* and 7*b* schematically illustrate the principle behind the megasonic probe energy director. In FIG. 7*a* (the arrangement of which is shown in exploded perspective view in FIG. 6), an annular coupler 222 is disposed between the heat transfer element 134 and the probe 104. The coupler 222 includes a circular recess 218 in a central portion thereof. The circular recess 218 thus creates a gap between a portion of the heat transfer element 134 and a portion of the probe end face 104*e*. This circular recess 218 either contains a vacuum, or is filled with air or other gas. Vacuums and gases are very poor conductors of megasonic energy. Thus, as FIG. 7*a* shows, the megasonic waves 220 traveling through the central portion of the heat transfer element 134 are blocked at the heat transfer element-gas interface and never reach the probe 104. Similarly, in the configuration of FIG. 7*b*, a disk-shaped coupler 222 extending from the heat transfer element 134 produces a physical separation between annular portions of the heat transfer element 134 and the probe 104 around the coupler 222, blocking the megasonic wave transmission between these areas.

Figure 8A:
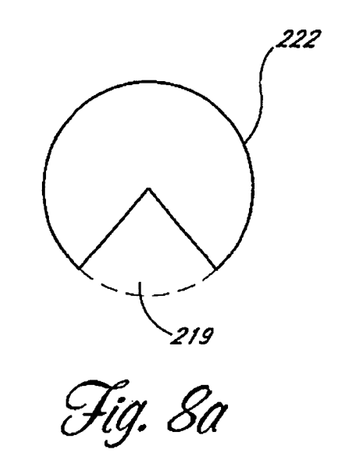
FIGS. 8a-8d are front views of preferred cross-sectional shapes for the coupler of the megasonic probe energy director.
Figure 8B:
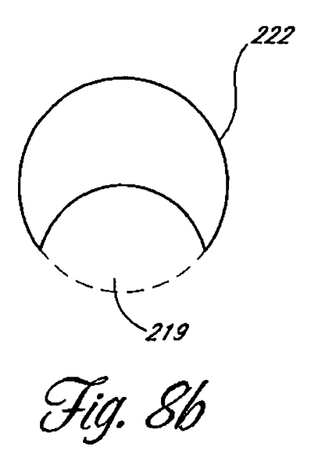
Figure 8C:
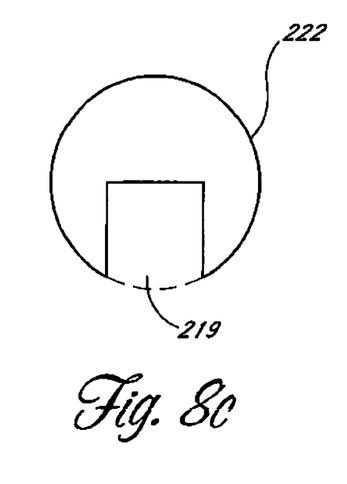

FIGS. 8*a*-8*d* illustrate preferred cross-sectional shapes for the coupler 222. FIGS. 8*a*-8*c* each resemble a pie with a missing piece, thus creating a gap 219. In the assembled megasonic energy cleaning apparatus, this gap 219 is preferably located at the lower extent of the probe base 104*d*. In this configuration, the gap 219 blocks the megasonic waves that would otherwise be transmitted to the lower edge of the probe cleaning portion 104*a*. The pattern of wave emission from the cleaning portion 104*a* is thus different from the radial pattern that is characteristic of the prior art device described above. Advantageously, the amount of normal-incident waves is reduced, resulting in decreased wafer damage.

Figure 8D:
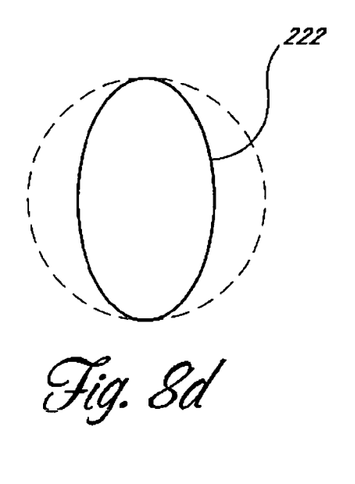

The shape of FIG. 8*d* is substantially elliptical. A major axis of the ellipse is preferably oriented vertically. Similarly to the cross-sectional shapes of FIGS. 6*a*-6*c*, the elliptical coupler 222 alters the pattern of wave emission from the probe cleaning portion, decreasing wafer damage.

Although the illustrated shapes are well-suited to decreasing wafer damage, there may be a range of equivalent shapes that are equally well-suited. It will be understood by one skilled in the art that the pictured examples are in no way intended to limit the scope of coverage.

Figure 9:
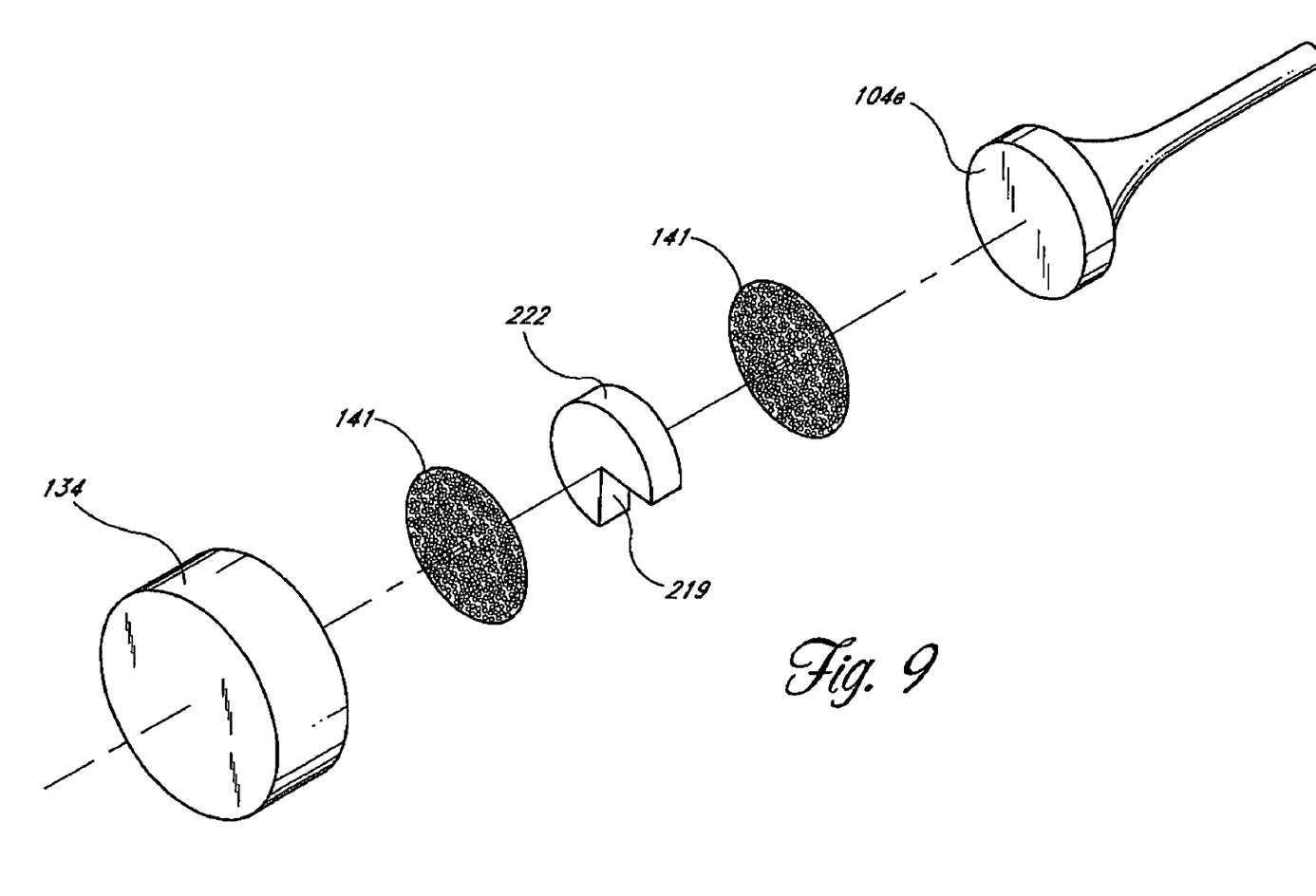
FIG. 9 is an exploded view of a preferred embodiment of the heat transfer element-coupler-probe interface of the megasonic probe energy director.

Similar to the prior art assembly of FIG. 1, in one preferred embodiment the coupler 222 is bonded to both the heat transfer element 134 and the probe end face 104*c* using an adhesive. As FIG. 9 illustrates, a thin screen 141 is preferably sandwiched between both interfaces. The screen 141 both increases the strength of the bond and makes the bond more resistant to damage that might be caused by the megasonic vibration. In another preferred embodiment, the interfaces between the coupler 222 and the heat transfer element 134, and between the coupler 222 and the probe end face 104*e*, include a thin screen 141 and vacuum grease to increase the megasonic energy transmission efficiencies of the interfaces. In this embodiment, the probe 104 is pressed against the coupler 222, and the coupler 222 against the heat transfer element 134, by a spring 143 as in FIG. 4, or by other suitable apparatus.

Rather than bonding or otherwise securing the coupler 222 to the heat transfer element 134, the coupler 222 may instead comprise an integral surface feature of the heat transfer element 134. A face of the heat transfer element 134 opposite the transducer 140 may, for example, be machined to include a protruding surface feature having a cross-section similar to those of FIGS. 8*a*-8*d*. In such an embodiment, the construction of the probe assembly is similar to that of FIG. 9, except that the coupler 222 is integral with, or formed from the same piece of material as, the heat transfer element 134. The screen 141 that appears between these two elements in FIG. 9 is, of course, not present in this embodiment.

Figure 10:
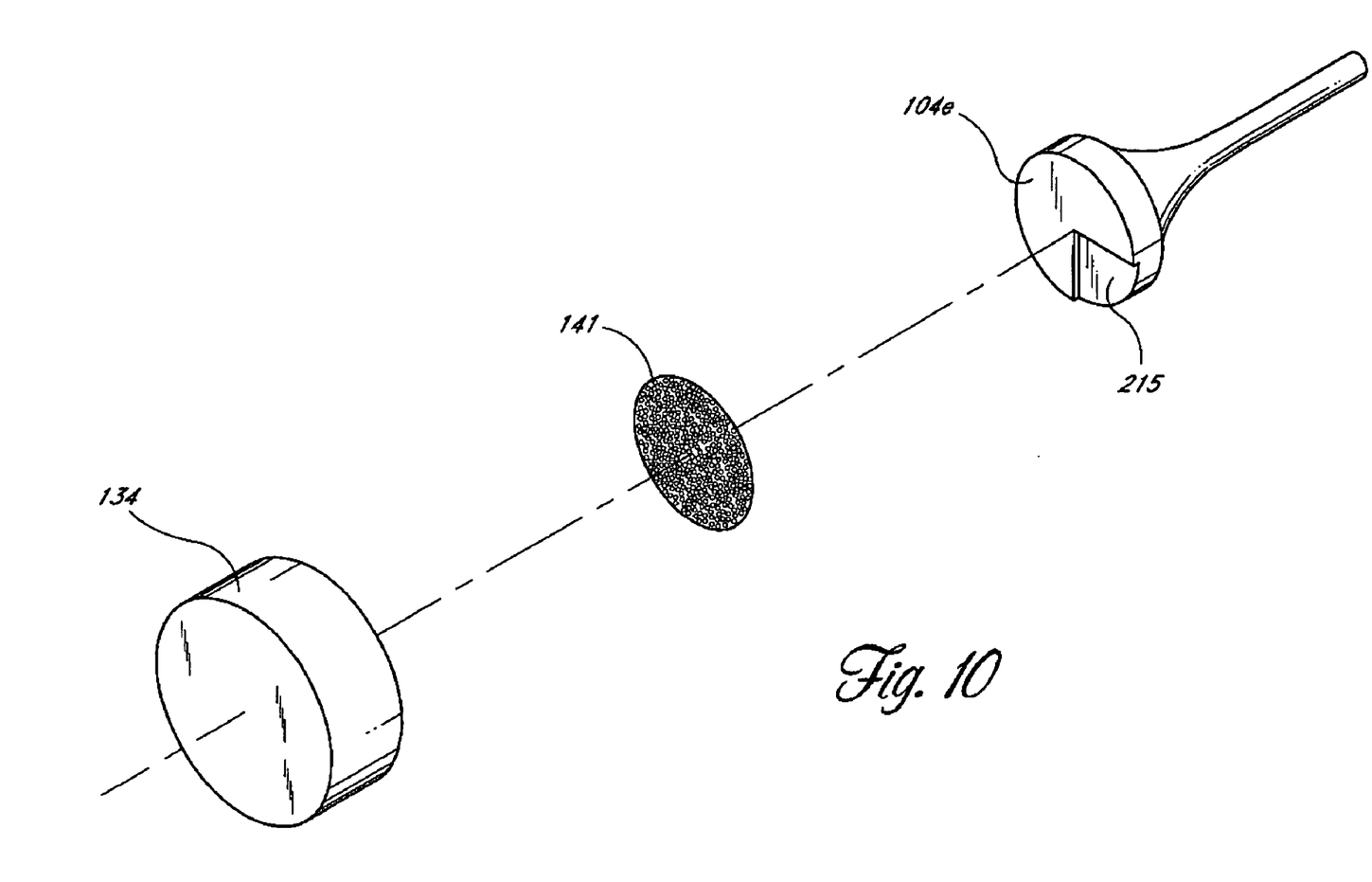
FIG. 10 is an exploded view of another preferred embodiment of the heat transfer element-probe interface of the megasonic probe energy director.

In an alternative embodiment, a recess (not shown) in a face of the heat transfer element 134, or a recess 215 (FIG. 10) in the probe end face 104*e* replaces the coupler 222. A gap in the heat transfer element 134, however, is preferably located a sufficient distance from the edges of the heat transfer element 134 so as not to compromise the seals created by the O-rings 135, 137. In either embodiment, a gap is created between a portion of the heat transfer element 134 aid a portion of the probe end face 104*c*. These configurations create similar disruptions in the pattern of sonic wave transmission from the probe cleaning portion 104*a*. The probe end face 104*e* or heat transfer element 134 could be provided with any of the cut-out shapes pictured in FIGS. 8*a*-8*d*, or any other suitable shapes not pictured.

What is claimed is:

1. A method of cleaning a substrate comprising the steps of:
providing a transmitter made of a material that is a good conductor of megasonic energy;
positioning the transmitter so that a lower edge is positioned spaced from but closely adjacent to a substantially flat surface of the substrate so that when liquid is applied to the edge and the substrate, a meniscus of liquid is formed between the edge and the substrate;
providing a transducer for producing megasonic vibration;
coupling the transducer to the transmitter so that a transmission path is created to transmit the megasonic vibration into the transmitter; and
creating a barrier in the transmission path so that the liquid vibration is attenuated directly beneath the probe lower edge by forming a recess in a rear face of the transmitter, with the recess being axially aligned with said transmitter lower edge.

2. A method of cleaning a substrate comprising the steps of:
providing a transmitter made of a material that is a good conductor of megasonic energy;
positioning the transmitter so that a lower edge is positioned spaced from but closely adjacent to a substantially flat surface of the substrate so that when liquid is applied to the edge and the substrate, a meniscus of liquid is formed between the edge and the substrate;
providing a transducer for producing megasonic vibration;

coupling the transducer to the transmitter so that a transmission path is created to transmit the megasonic vibration into the transmitter;

positioning a separate element in said transmission path; and creating a barrier in the transmission path so that the liquid vibration is attenuated directly beneath the probe lower edge, said barrier is formed by creating a gap in said separate element.

3. A method of cleaning a substrate comprising the steps of:

providing a transmitter made of a material that is a good conductor of megasonic energy;

positioning the transmitter so that a lower edge is positioned spaced from but closely adjacent to a substantially flat surface of the substrate so that when liquid is applied to the edge and the substrate, a meniscus of liquid is formed between the edge and the substrate;

providing a transducer for producing megasonic vibration;

coupling the transducer to the transmitter so that a transmission path is created to transmit the megasonic vibration into the transmitter;

positioning a heat transfer element to form part of said transmission paths;

creating a barrier in the transmission path so that the liquid vibration is attenuated directly beneath the probe lower edge, the barrier created by configuring the heat transfer element; and conducting heat transfer fluid in heat transfer relation with said heat transfer element to conduct heal away from said transducer.

* * * * *